US008390466B2

(12) United States Patent
Feldstein et al.

(10) Patent No.: US 8,390,466 B2
(45) Date of Patent: Mar. 5, 2013

(54) CABLE CLAMP-ON DEVICE INCLUDING A USER INTERFACE

(75) Inventors: George Feldstein, Cresskill, NJ (US); Mark LaBosco, New City, NY (US); Esteban Dragonanovic, Nyack, NY (US); Philip Bellingham, White Plains, NY (US)

(73) Assignee: Crestron Electronics Inc., Rockleigh, NJ (US)

( * ) Notice: Subject to any disclaimer, the term of this patent is extended or adjusted under 35 U.S.C. 154(b) by 318 days.

(21) Appl. No.: 13/005,102

(22) Filed: Jan. 12, 2011

(65) Prior Publication Data

US 2012/0177377 A1    Jul. 12, 2012

(51) Int. Cl.
*G08B 21/00* (2006.01)
(52) U.S. Cl. ........................................ 340/654; 340/635
(58) Field of Classification Search .................. 340/654, 340/635
See application file for complete search history.

(56) References Cited

U.S. PATENT DOCUMENTS

| | | |
|---|---|---|
| 4,031,449 A | 6/1977 | Trombly |
| 4,645,996 A | 2/1987 | Toops |
| 4,727,600 A | 2/1988 | Avakian |
| 4,915,645 A | 4/1990 | Konnemann et al. |
| 4,975,926 A | 12/1990 | Knapp |
| 5,341,083 A | 8/1994 | Klontz et al. |
| 6,081,356 A | 6/2000 | Branc et al. |
| 6,086,007 A | 7/2000 | Till |
| 6,633,281 B2 | 10/2003 | Lin et al. |
| 6,778,845 B2 | 8/2004 | Kaegebein |
| 7,568,945 B2 | 8/2009 | Chee et al. |
| 7,719,438 B2 | 5/2010 | Hardacker et al. |
| 7,731,516 B2 | 6/2010 | Puttinger et al. |
| 7,779,516 B2 | 8/2010 | Morris |
| 7,806,723 B2 | 10/2010 | Chong et al. |
| 7,811,365 B2 | 10/2010 | Grzonka et al. |
| 7,821,250 B2 | 10/2010 | Turner et al. |
| 8,149,102 B1 * | 4/2012 | Miller et al. ................. 340/506 |
| 2003/0103075 A1 | 6/2003 | Rosselot |
| 2004/0014357 A1 | 1/2004 | Madera et al. |
| 2006/0005988 A1 | 1/2006 | Jorgensen |
| 2007/0153128 A1 | 7/2007 | Adcock et al. |
| 2012/0154140 A1 * | 6/2012 | Blanchard ................. 340/539.1 |
| 2012/0176247 A1 * | 7/2012 | Feldstein et al. ............. 340/654 |

* cited by examiner

*Primary Examiner* — Travis Hunnings
(74) *Attorney, Agent, or Firm* — Crestron Electronics Inc.

(57) ABSTRACT

In an illustrative embodiment, a cable clamp (100) comprises a first half member (110) and a second half member (115). Each of the half members comprises first and second mating surfaces (120, 125), and interior and exterior surfaces (130, 135). The half members are connected at the first mating surfaces thereof such that the half members form a passageway (140) for receiving a cable (145) therethrough. The clamp further comprises at least one actuator (150) disposed on one of the exterior surfaces, at least one indicator (155) disposed on one of the exterior surfaces, and a transceiver (160) configured to transmit data regarding the at least one actuator and to receive data regarding the indicator via a wireless link.

50 Claims, 15 Drawing Sheets

CABLE CLAMP-ON DEVICE INCLUDING A USER INTERFACE

BACKGROUND OF THE INVENTION

1. Technical Field

The present invention relates to a cable clamp-on device useful for coupling audio/visual devices to a network. More particularly, the invention relates to a cable clamp-on device including a user interface for communicating command/status information with a computer via a wireless communication link in a bidirectional manner.

2. Background Art

As computers become faster and more capable, there are more opportunities to employ various multimedia technologies to enhance presentations. In conference room environments, each user's computer can have varied capabilities, which can be problematic when providing information of a specific type to many users. For example, in a conference room environment, computers are often connected to a wide variety of audio and visual equipment. Often there are cables located near conference room tables for plugging in computers, audio visual (AV) sources, and other conference room devices.

Once the conference room cable is plugged into a user's computer, the user turns on the conference room device by using a controller. The user interacts with the controller, for example, to route a particular signal source that is connected to the computer to one of the conference room devices; for example, a projector screen. Often, there are problems associated with both plugging in the cable and using the controller. For example, the user may plug a cable into the computer without knowing whether there is an active signal in the cable. The user may attempt to fix the inactive signal by using his/her computer to activate the signal in the cable. Further, the user may not be familiar with how to use a particular controller available in a conference room. The attempted use of an unfamiliar controller or plugging a computer with an inactive signal into a conference room cable often results in delays and/or calls to technical support personnel. Problems that are not quickly resolved often require dispatching someone to the conference room. As a result, valuable time and resources are lost in many conferences while room coordinators are located, equipment power is cycled, and help is summoned.

Therefore, there is a need in the art for devices and methods that enhance a user's setup experience in a conference room environment.

SUMMARY OF THE INVENTION

It is to be understood that both the general and detailed descriptions that follow are exemplary and explanatory only and are not restrictive of the invention.

DISCLOSURE OF INVENTION

Principles of the invention provide devices and methods for communicating command/status information to a computer via a wireless communication link in a bidirectional manner. For example, in the first aspect of the invention, a cable clamp comprises a first half cylindrical member and a second half cylindrical member. Each of the first and second half cylindrical members includes first and second mating surfaces, and interior and exterior surfaces. The first and second half cylindrical members are connected at the first mating surfaces thereof so that the first and second half cylindrical members form a passageway for receiving a cable therethrough. The cable clamp further comprises at least one actuator disposed on one of the exterior surfaces, at least one indicator disposed on one of the exterior surfaces, and a transceiver configured to transmit data regarding the at least one actuator and to receive data regarding the at least one indicator via a wireless link.

In another embodiment, the cable clamp further comprises a processing unit coupled to the at least one actuator, the at least one indicator, and the transceiver. The processing unit is located within one of the first and second half cylindrical members. The cable clamp further comprises a memory device configured to store data regarding the at least one actuator and the at least one indicator.

In yet another embodiment, the transceiver is an infrared transceiver configured to transmit/receive data regarding the at least one actuator and the at least one indicator.

In yet another embodiment, the transceiver is configured to receive a first status message from a gateway that indicates that a video signal is available in the cable. The transceiver is further configured to transmit a command message to the gateway to accept the video signal.

In yet another embodiment, the at least one indicator comprises second and third indicators. Each of the first and second indicators is configured to display an "on" state and an "off" state. The first indicator is in the "on" state to indicate reception of the first status message by the transceiver. The first indicator is in the "off" state to indicate non-reception of the first status message by the transceiver.

In yet another embodiment, the second and third indicators are configured to display at least five states differentiated by color. The first colored state is in the "off" state when the cable clamp is powered off. The second colored state is activated when the cable clamp is in the powered "on" state. The third colored state is activated when the video signal is active in the cable and selected by the gateway. The fourth colored state is activated in response to the at least one actuator being activated. The fifth colored state is activated in response to a computer configured to transmit informational data in the cable.

In a second aspect of the invention, a cable clamp comprises a first half member and a second half member. Each of the first and second half members includes first and second mating surfaces, and interior and exterior surfaces. The first and second half members are connected at the first mating surfaces thereof such that the first and second half members form a passageway for receiving a cable therethrough. The cable clamp further comprises at least one actuator disposed on one of the exterior surfaces; first, second, and third indicators disposed on one of the exterior surfaces; and a transceiver. The transceiver is configured to transmit data regarding the at least one actuator and to receive data regarding the at least one indicator via a wireless link. The transceiver is further configured to receive a first status message from a gateway that indicates that a video signal is available in the cable and to transmit a command message to the gateway to accept the video signal. Each of the first and second indicators is configured to display an "on" state and an "off" state. The first indicator is in the "on" state to indicate reception of the first message by the transceiver. The first indicator is in the "off" state to indicate non-reception of the first message by the transceiver. The second and third indicators are configured to display at least five states differentiated by color. The first colored state is in the "off" state when the cable clamp is powered off. The second colored state is activated when the cable clamp is in the powered "on" state. The third colored state is activated when the video signal is active in the cable and selected by the gateway. The fourth colored state is activated in response to the at least one actuator being activated to accept the video signal. The fifth colored state is activated in response to a computer configured to transmit informational data in the cable.

In a third aspect of the invention, a system for connecting a computer to an integrated AV presentation system comprises a cable clamp configured for bidirectional communications with at least one conference room device. The cable clamp comprises a passageway for receiving a cable therethrough, at least one actuator, at least one indicator, a transceiver, a receptacle, and a cable retractor. The transceiver is configured to transmit data regarding the at least one actuator and to receive data regarding the at least one indicator via a wireless link. The receptacle is located within a cable storage compartment. The receptacle is connectable and disconnectable from the cable clamp. The cable retractor is configured to retract and store a length of the cable.

In a fourth aspect of the invention, a method for communicating information to an integrated AV presentation system comprises the steps of providing a cable clamp for bidirectional communications with at least one conference room device. The cable clamp comprises top and bottom portions and first and second half members. Each of the first and second half members includes first and second mating surfaces. Each of the first and second half members includes interior and exterior surfaces. The first and second half members are connected at the first mating surfaces thereof such that the first and second half members form a passageway for receiving a cable therethrough. The method further comprises inserting the cable through the passageway in the clamp, mating the first and second half members, connecting a free end of the cable into a port of a computer, receiving a first status message from a gateway via a wireless link to a transceiver that indicates that a video signal is available in the cable, and transmitting a command message by the transceiver via the wireless link to the gateway to accept the video signal.

The present invention seeks to overcome or at least ameliorate one or more of several problems, including but not limited to: providing a cable clamp-on device including a user interface to prevent a user from plugging a computer with an inactive signal into a conference room cable.

BRIEF DESCRIPTION OF DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

BRIEF DESCRIPTION OF THE SEVERAL VIEWS OF THE DRAWINGS

Figure 1:
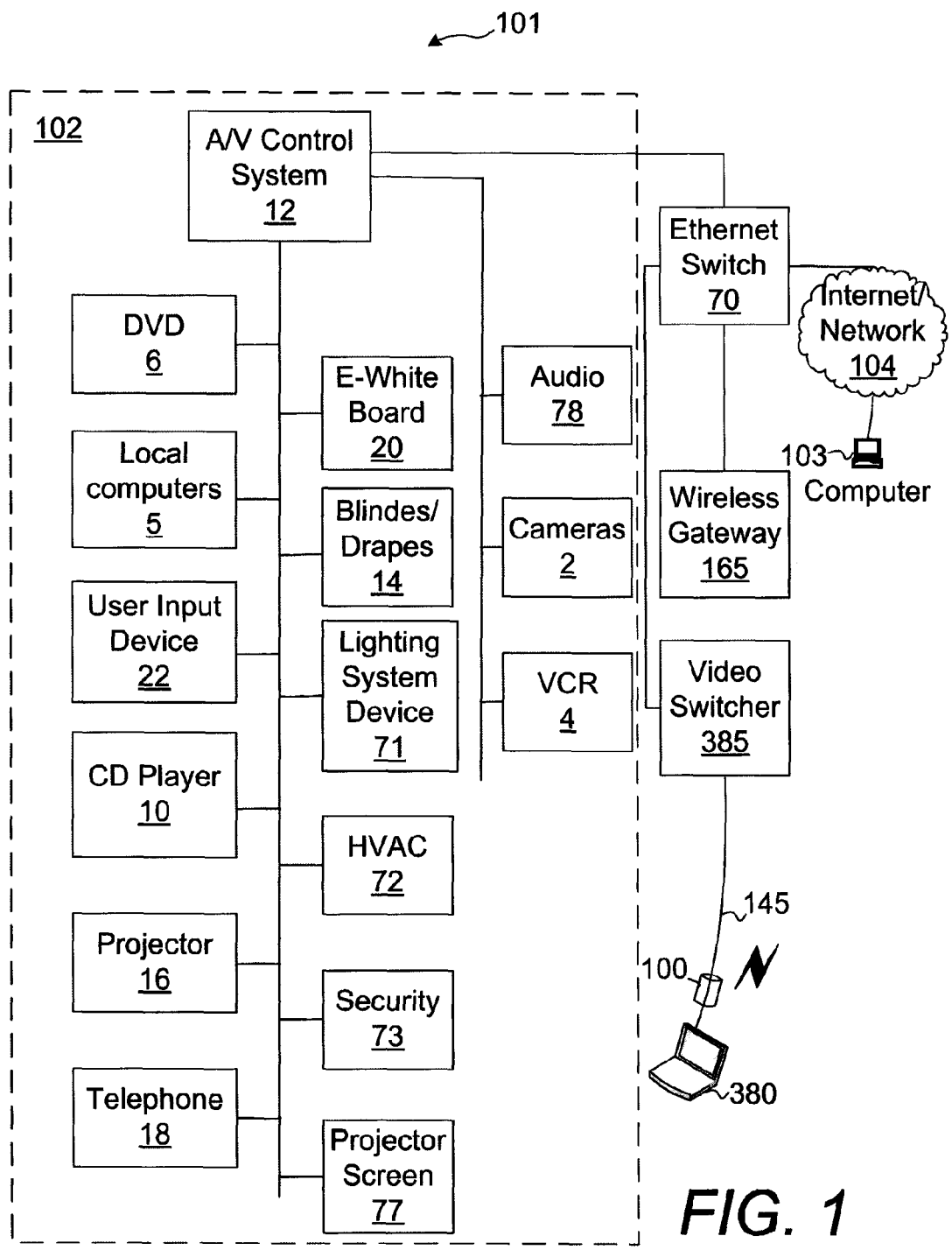

FIG. 1 illustrates a block diagram of a conference room with conference room devices in accordance with an illustrative embodiment of the present invention.

Figure 2:
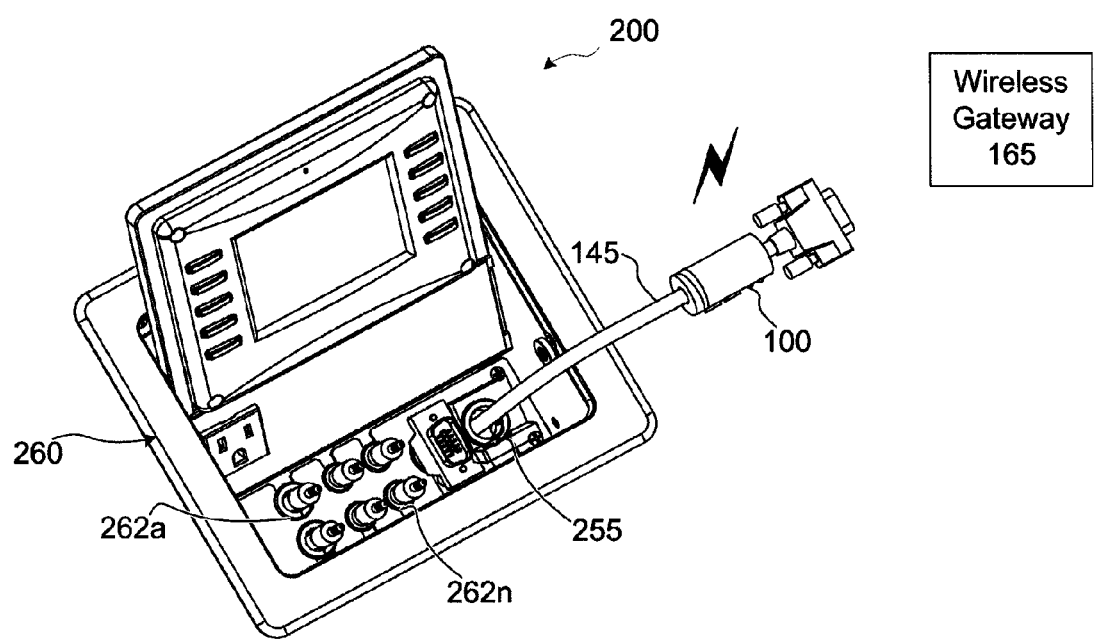

FIG. 2 illustrates a view of a system incorporating an inventive cable clamp-on device in accordance with an illustrative embodiment of the present invention.

Figure 3:
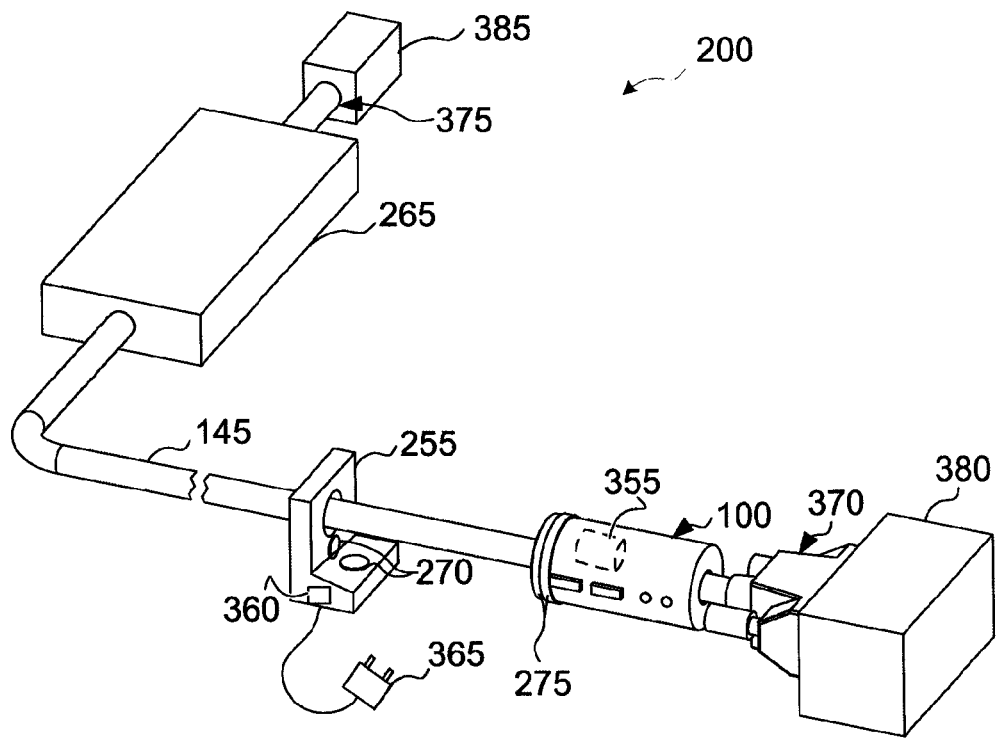

FIG. 3 is another view of the system in accordance with an illustrative embodiment of the present invention.

Figure 4:
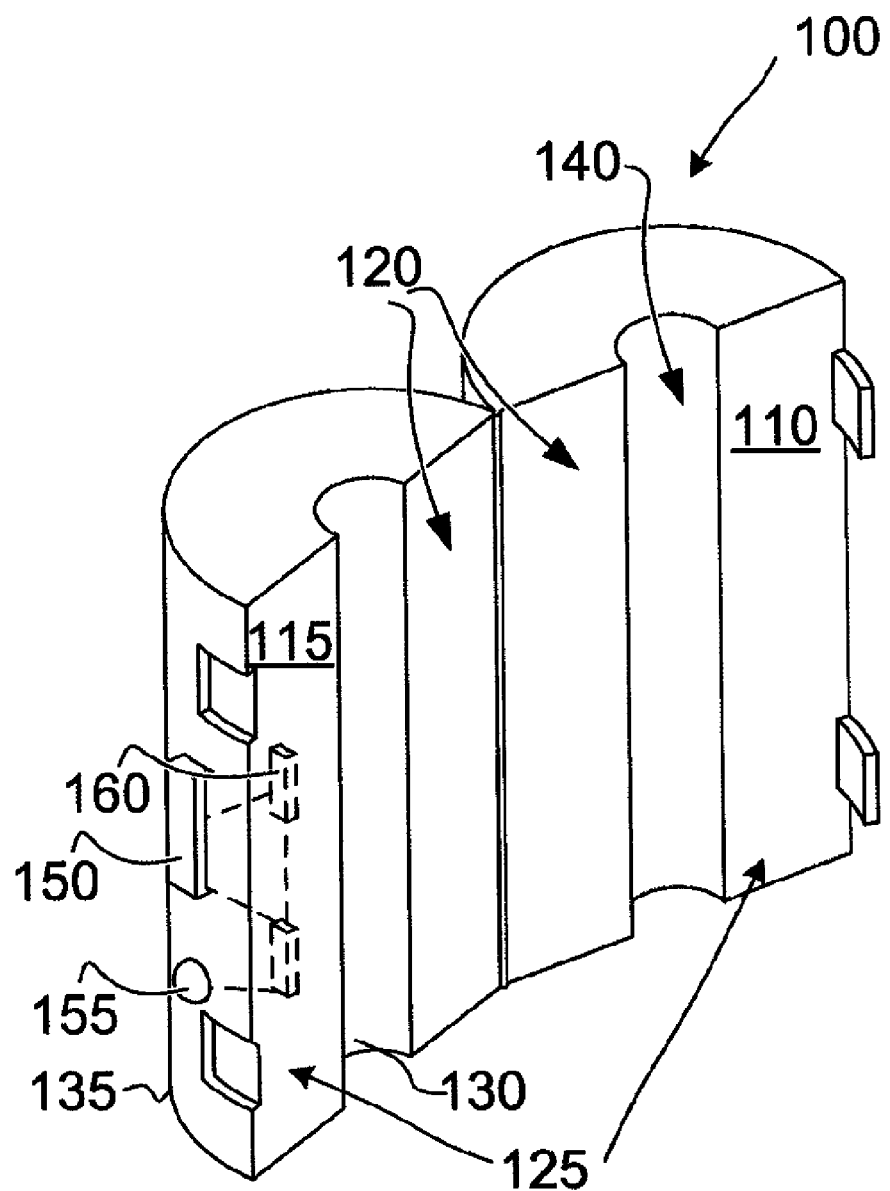

FIG. 4 illustrates an interior view of the cable clamp-on device in accordance with an illustrative embodiment of the present invention.

Figure 5:
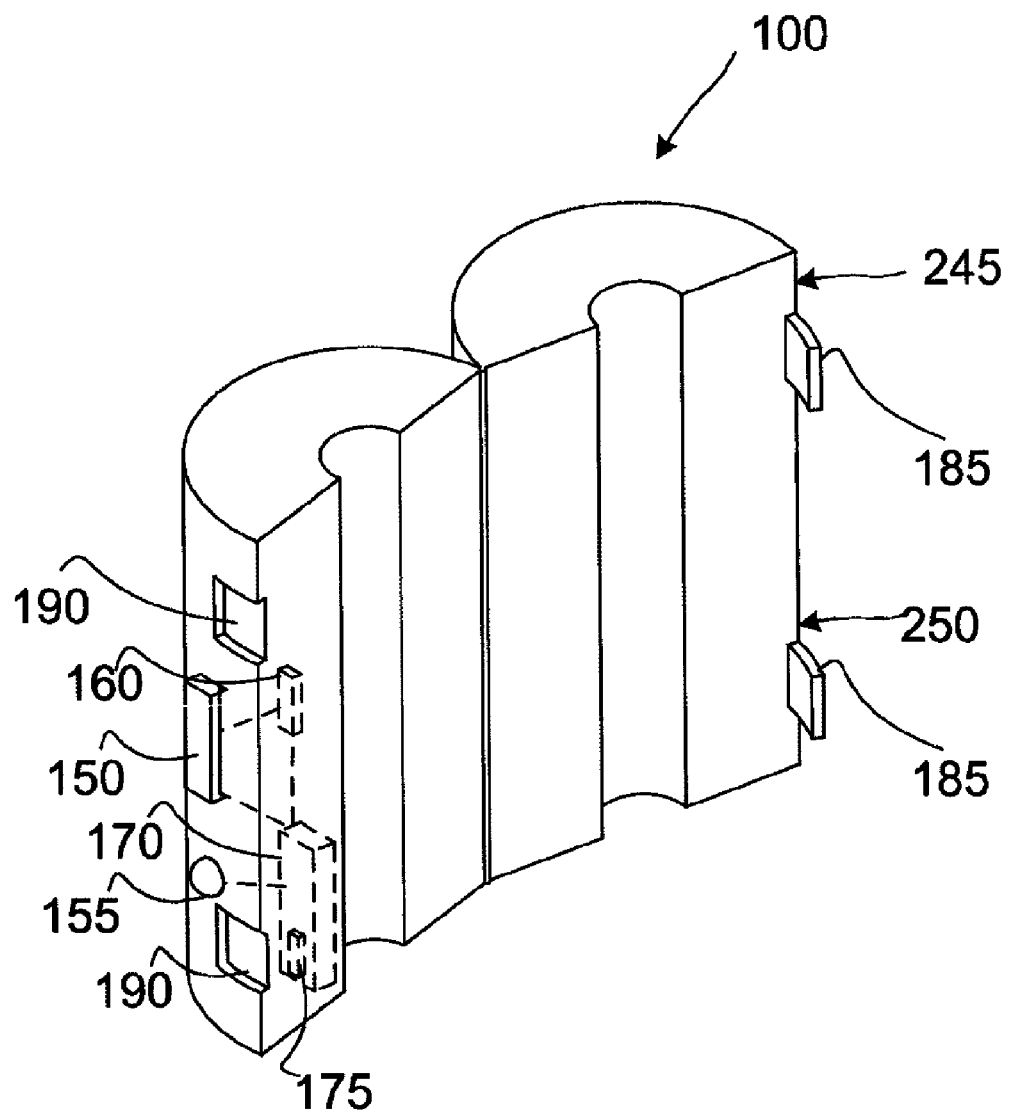

FIG. 5 illustrates another interior view of a cable clamp-on device in accordance with an illustrative embodiment of the present invention.

Figure 6:
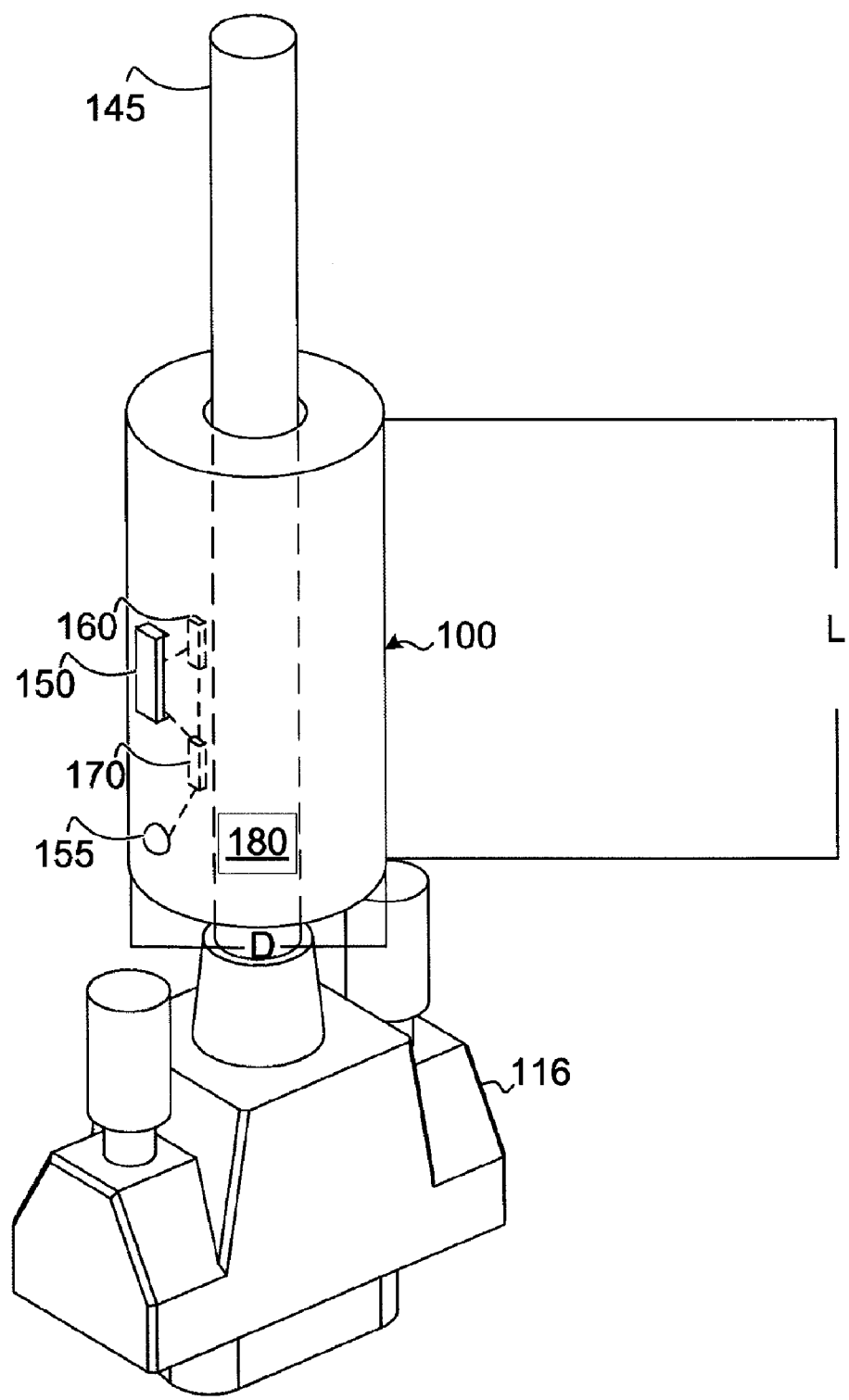

FIG. 6 illustrates an exterior view of the cable clamp-on device in accordance with an illustrative embodiment of the present invention.

Figure 7:
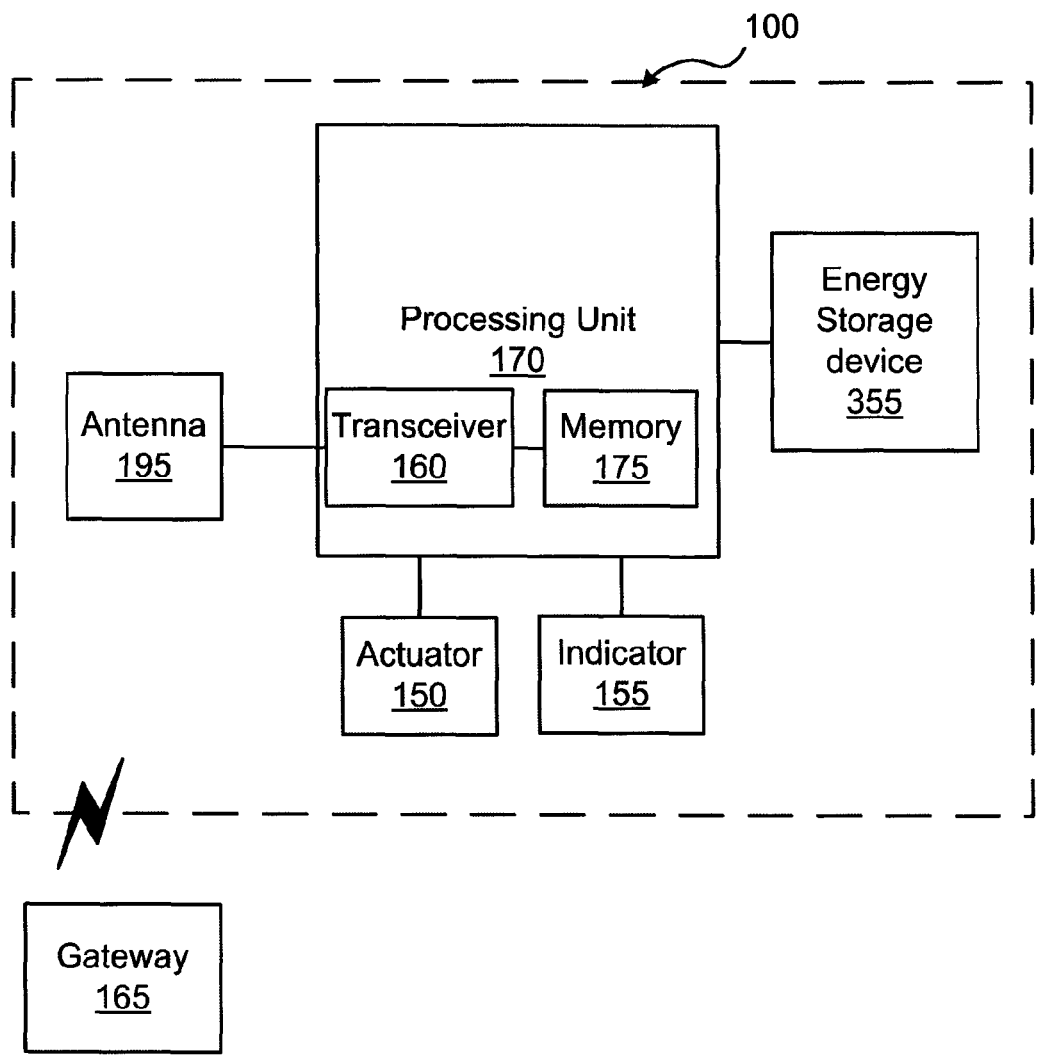

FIG. 7 illustrates an electrical block diagram of the cable clamp-on device in accordance with an illustrative embodiment of the present invention.

Figure 8:
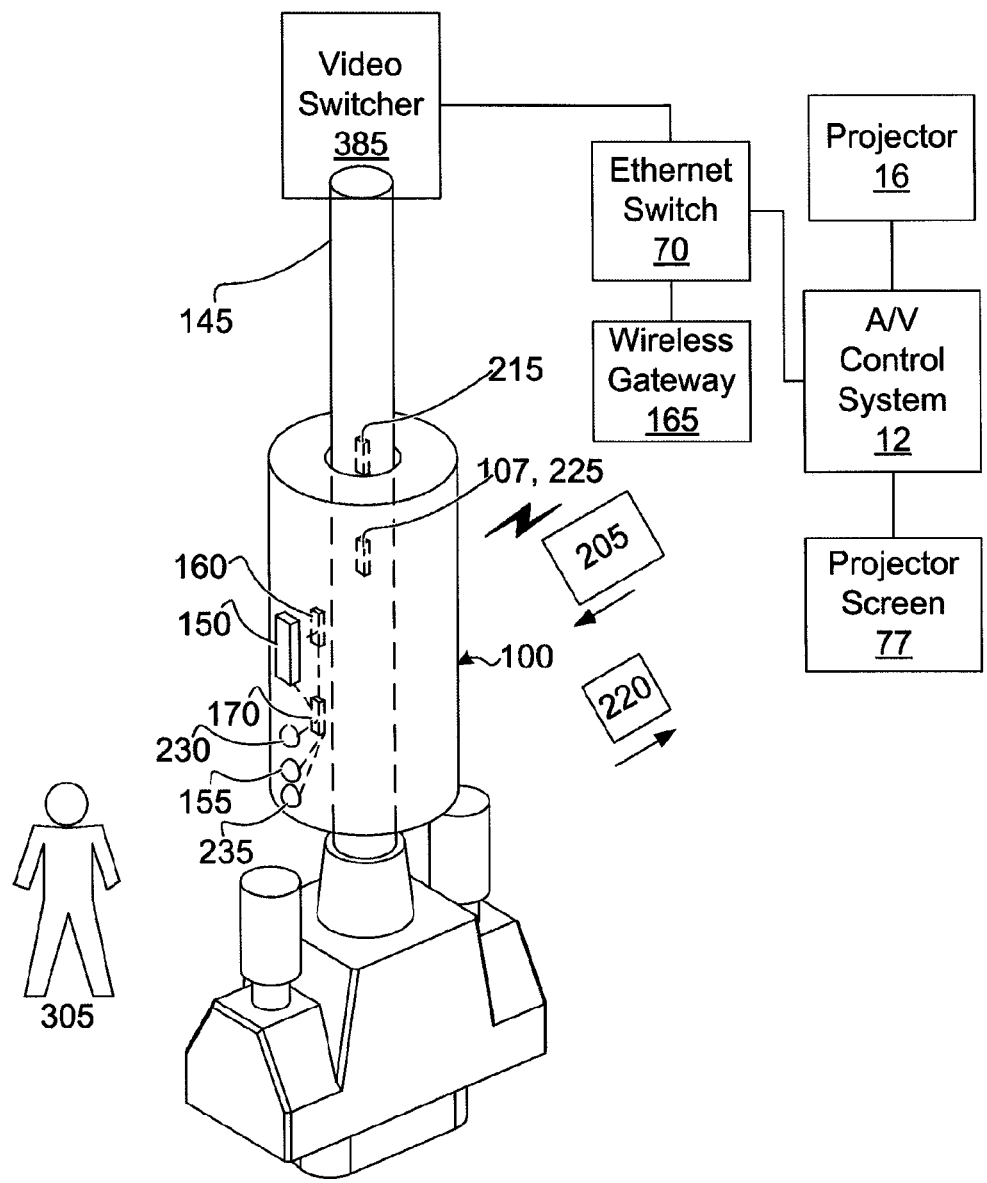

FIG. 8 illustrates the cable clamp in communication with a gateway in accordance with an illustrative embodiment of the present invention.

Figure 9:
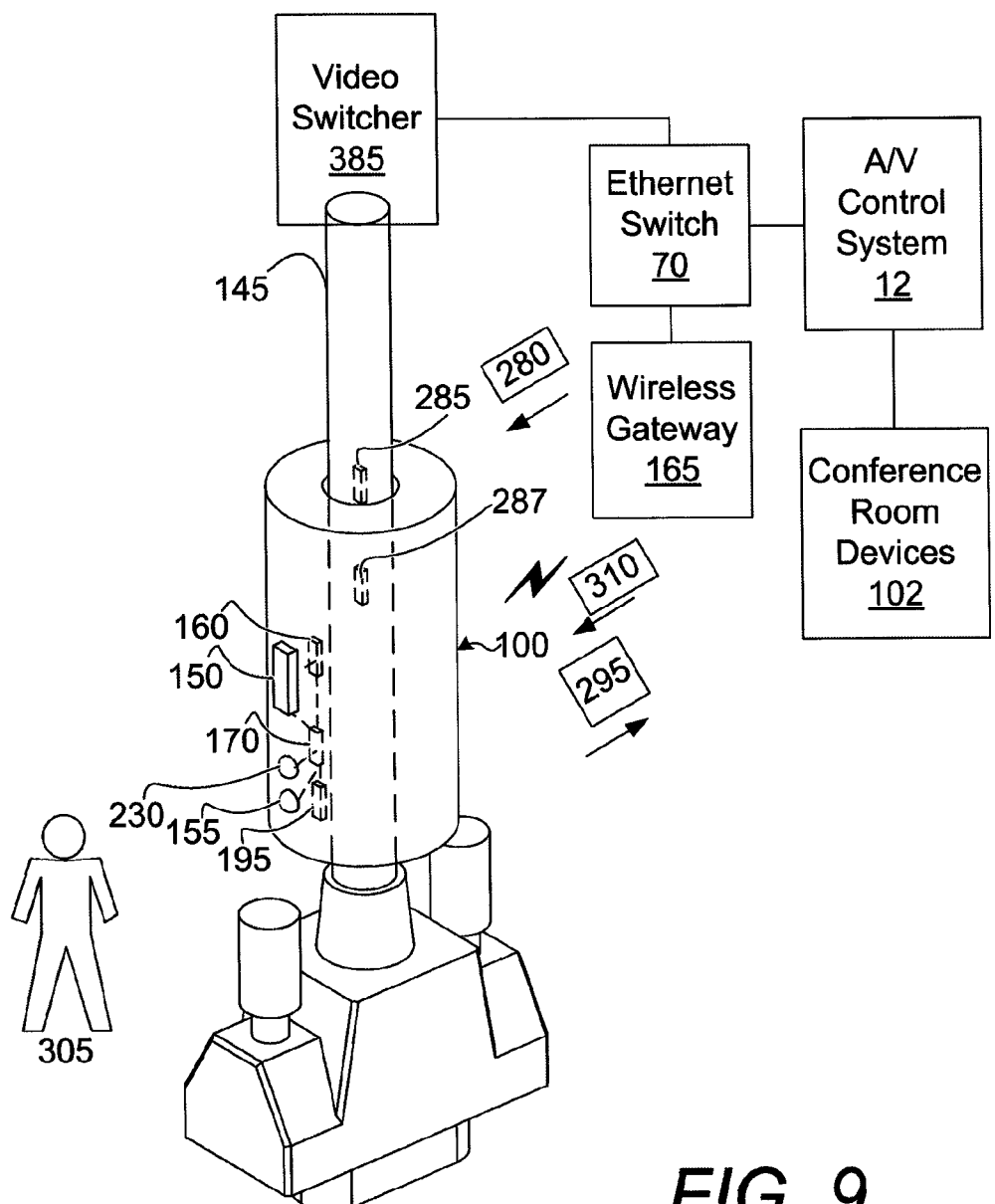

FIG. 9 illustrates the cable clamp-on device in communication with the gateway in accordance with another illustrative embodiment of the present invention.

Figure 10:
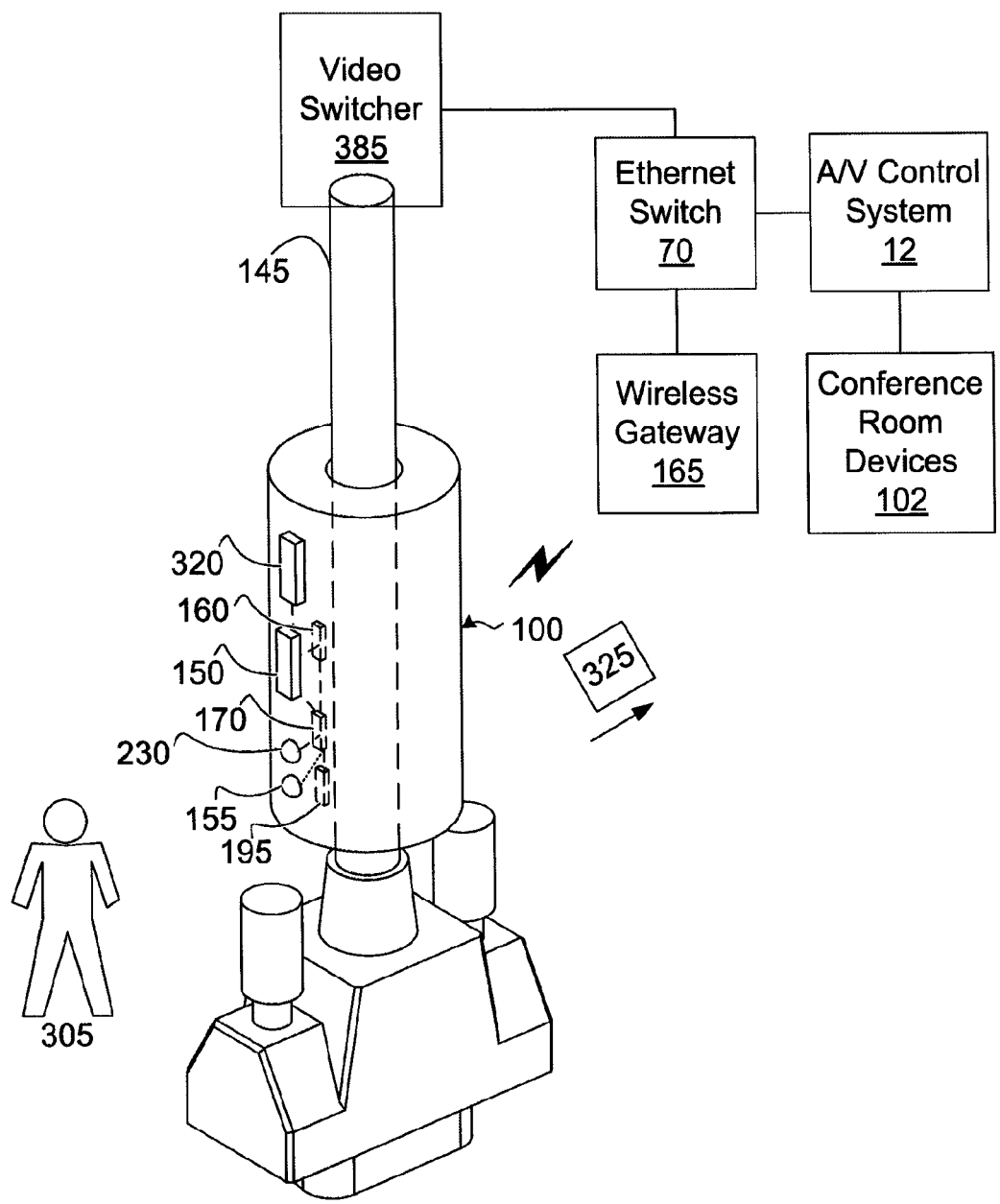

FIG. 10 illustrates the cable clamp-on device in communication with the gateway in accordance with yet another illustrative embodiment of the present invention.

Figure 11:
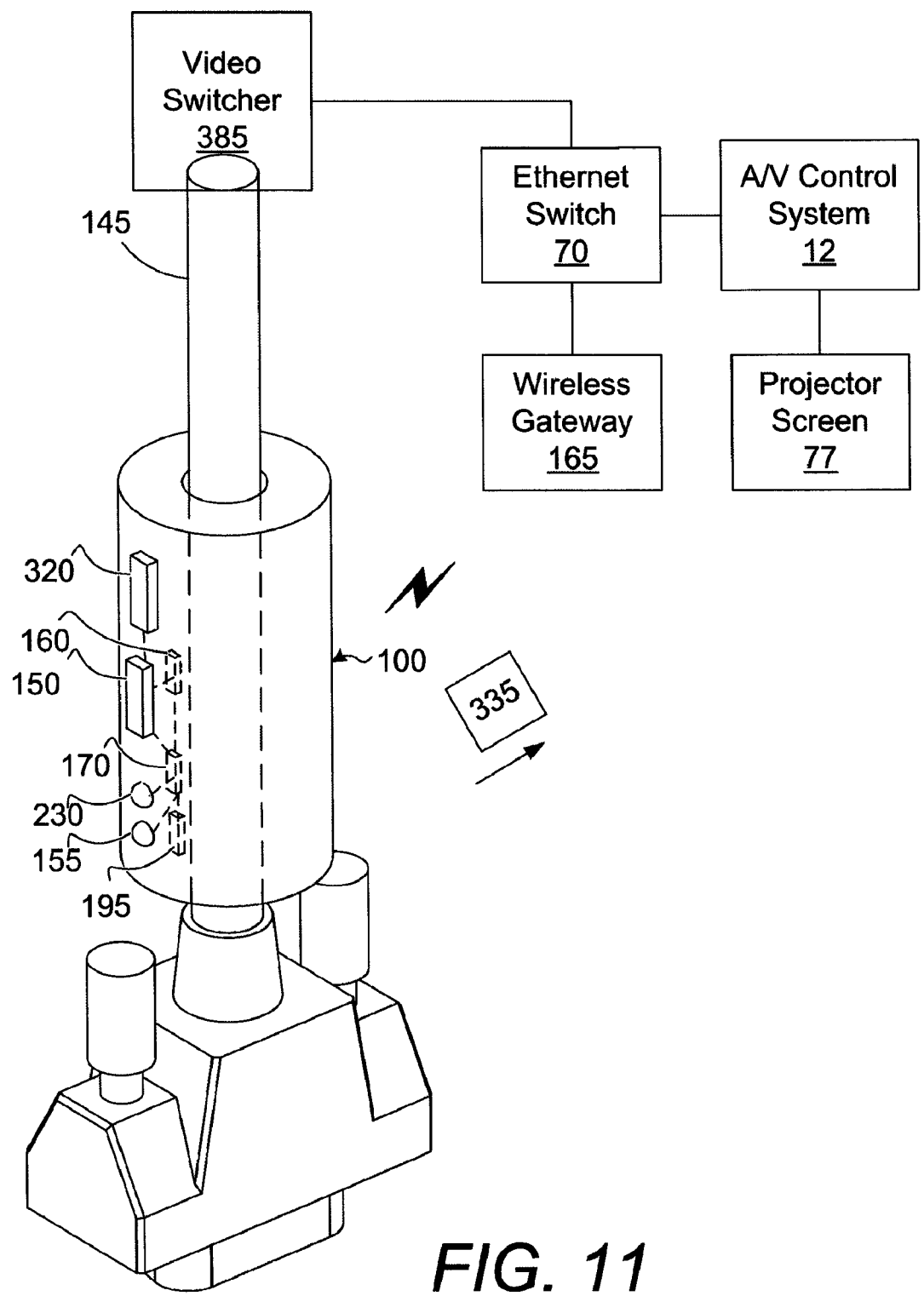

FIG. 11 illustrates the cable clamp-on device in communication with a gateway in accordance with yet another illustrative embodiment of the present invention.

Figure 12:
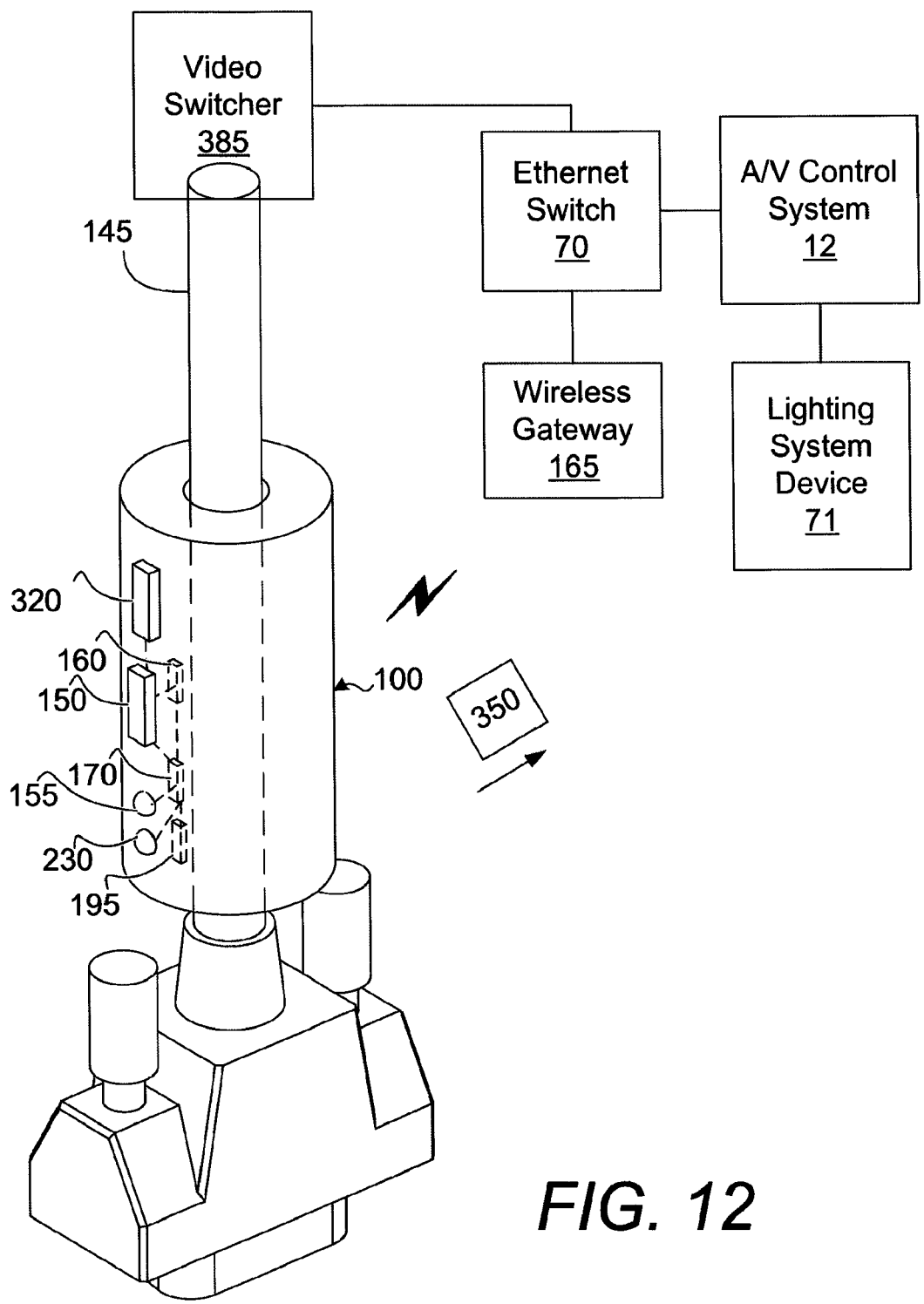

FIG. 12 illustrates the cable clamp-on device in communication with a gateway in accordance with yet another illustrative embodiment of the present invention.

Figure 13:
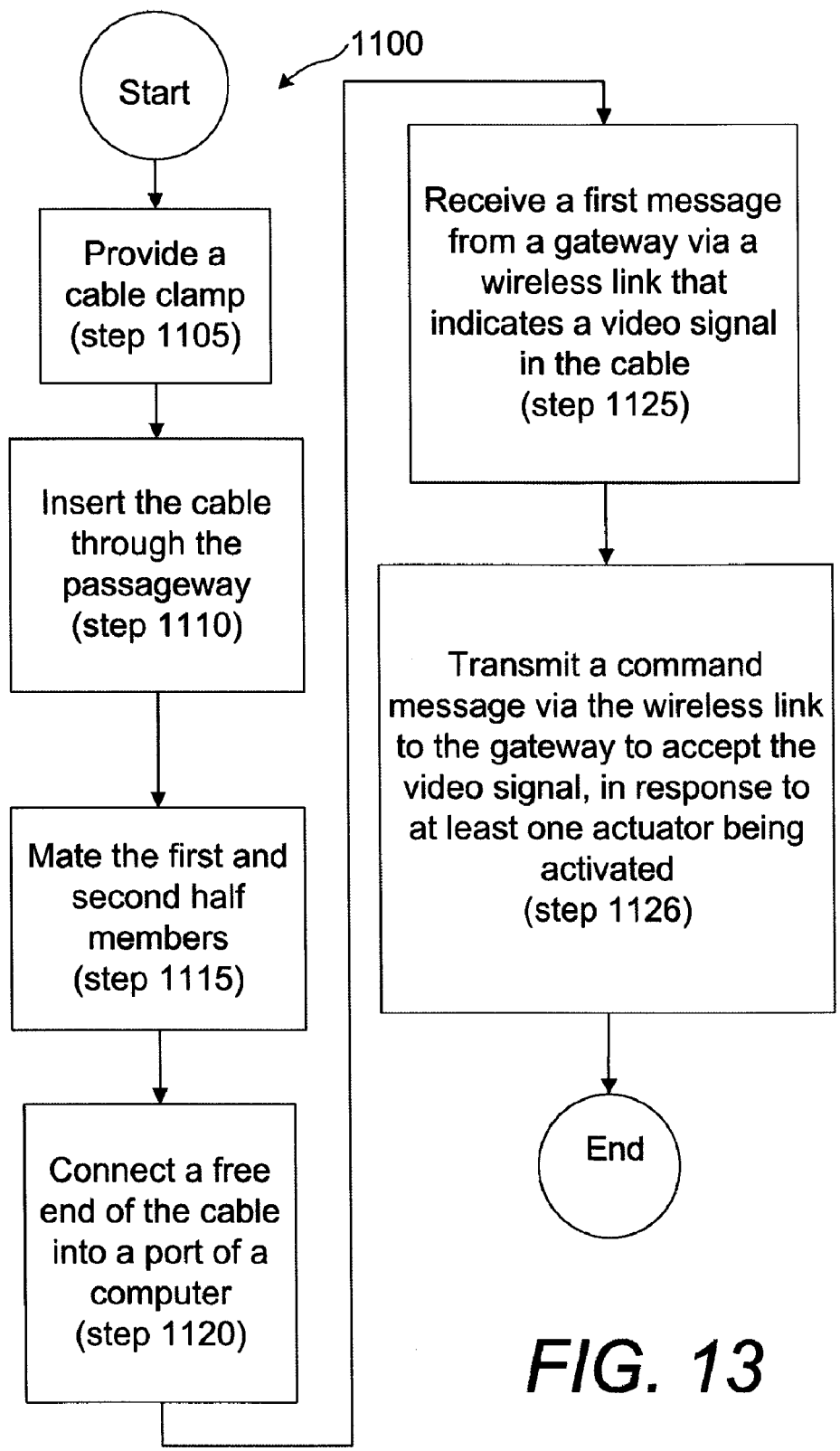

FIG. 13 illustrates a flowchart showing steps in accordance with an illustrative method of the present invention.

Figure 14:
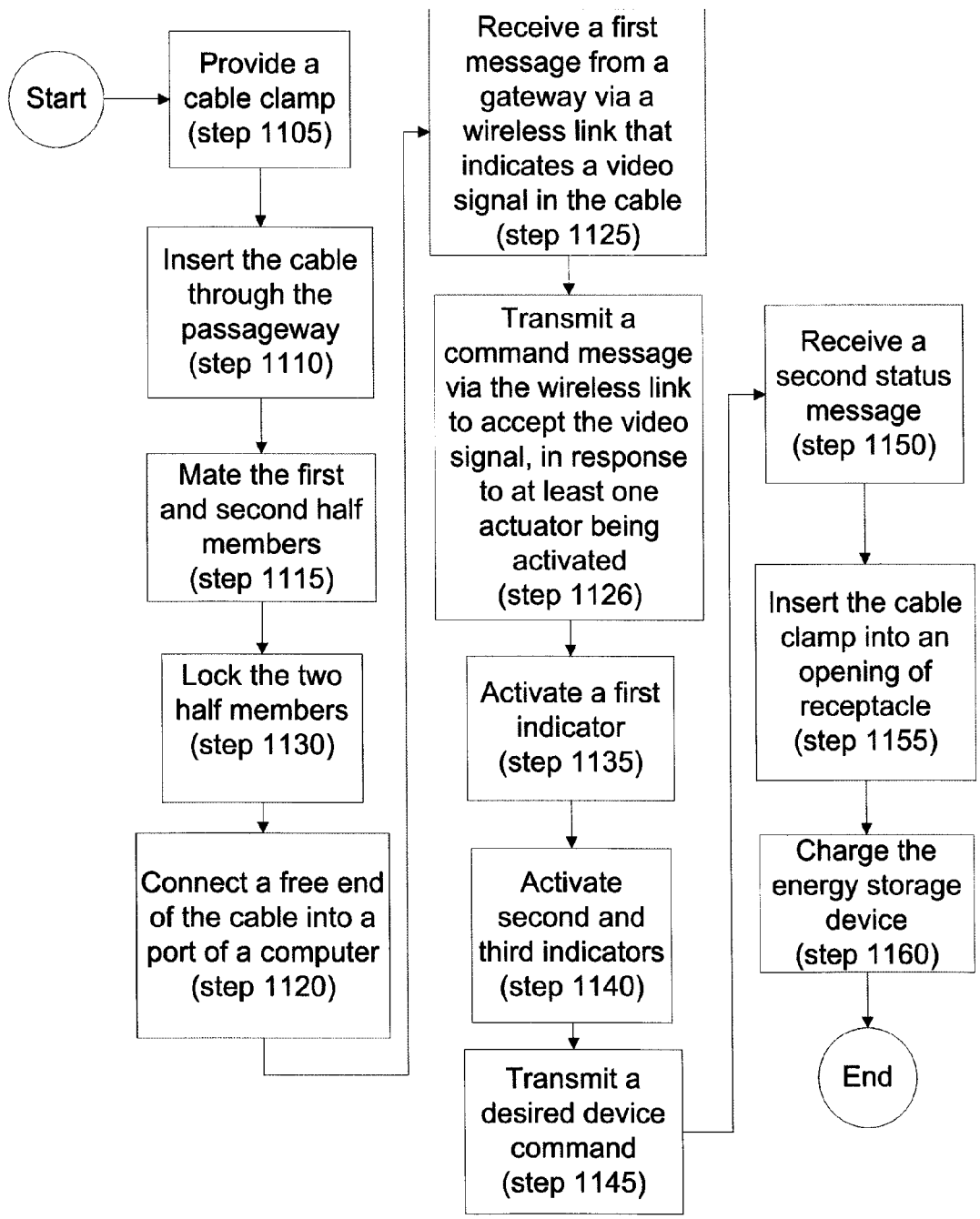

FIG. 14 illustrates a flowchart showing steps in accordance with another illustrative method of the present invention.

Figure 15:
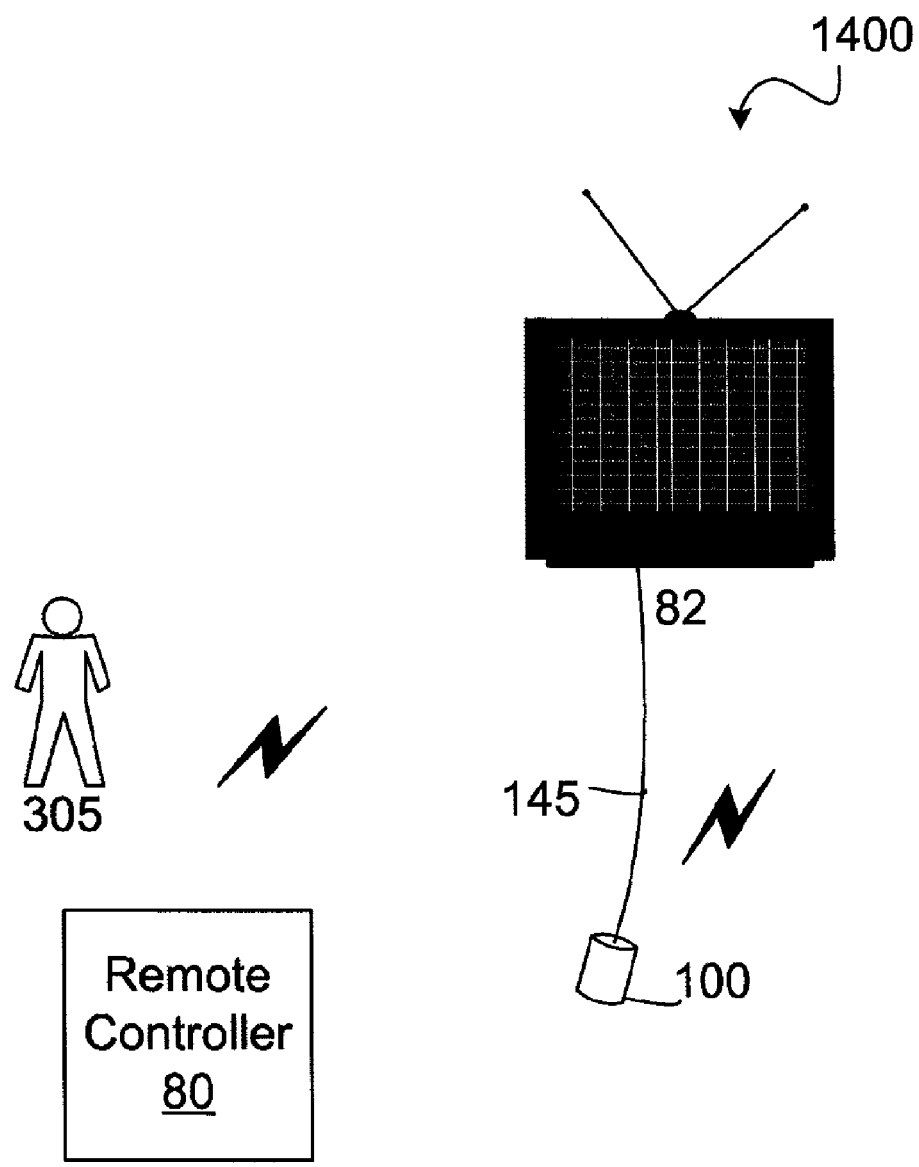

FIG. 15 illustrates a residential television environment that further includes an inventive cable clamp-on device in accordance with an illustrative embodiment of the present invention.

LIST OF REFERENCE NUMBERS FOR THE MAJOR ELEMENTS IN THE DRAWING

The following is a list of the major elements in the drawings in numerical order.

2 cameras
4 videocassette recorder
5 local computers
6 digital video disc
10 compact disc player
12 audio visual control system
14 blinds/drapes
16 projector
18 telephone
20 electronic white board
22 user input device
70 Ethernet switch
71 lighting system device
72 heating, ventilating, and air conditioning device
73 security devices
77 projector screen
78 audio speakers
80 remote controller
82 television
100 cable clamp-on device
101 conference room/meeting room
102 conference room devices
103 remotely located computer
104 computer network
107 external video signal
110 first half member (of cable clamp 100)
115 second half member (of cable clamp 100)
116 connector
120 first mating surface
125 second mating surface
130 interior surface
135 exterior surface
140 passageway
145 cable
150 one actuator 155 one indicator
160 transceiver
165 wireless gateway
170 processing unit
175 memory device
180 locking mechanism
185 one tab
190 one slot
195 antenna
200 system for connecting a computer to an AV system
205 first status message
215 video signal
220 command message
225 informational data
230 second indicator
235 third indicator
245 top portion (of cable clamp 100)
250 bottom portion (of cable clamp 100)
255 receptacle
260 cable storage compartment
262a-n cables
265 cable retractor
270 charging output contact
275 charging input contact
280 first status message
285 signal source
287 desired device signal
295 desired device command
305 user
310 second status message
320 second actuator
325 power message
335 control message
345 dimmer
350 dimmer message
355 energy storage device
360 contactless charging circuit
365 power cord
370 first end (of the cable)
375 second end (of the cable)
380 computer
385 audio/video switcher
1100 flowchart
1105 step of providing a cable clamp
1110 step of inserting the cable through the passageway
1115 step of mating the first and second half members
1120 step of connecting a free end of the cable
1125 step of receiving a first status message
1126 step of transmitting a command message
1130 step of locking the two half members
1135 step of activating a first indicator
1140 step of activating second and third indicators
1145 step of transmitting a desired device command
1150 step of receiving a second status message
1155 step of inserting the cable clamp
1160 step of charging the energy storage device
1400 schematic of a residential television environment

DETAILED DESCRIPTION OF THE INVENTION

Mode(s) for Carrying Out the Invention

The present invention relates to a cable clamp-on device for coupling audio/visual devices to a network. More particularly, the invention relates to a cable clamp-on device for communicating audiovisual information to a display system via a wireless communication link in a bidirectional manner.

FIG. 1 is a block diagram illustrating a conference room 101. The conference room 101 includes a plurality of conference room devices 102, which may be remotely controllable using an A/V control system 12. A computer 380 connected via a cable 145 is preferably located within a meeting or conference room 101 to facilitate connection to various conference room devices 102 and/or be an audio/video source. The computer 380 may be a laptop computer. In one embodiment, the computer 380 is directly connected to an audio/video switcher 385 via the cable 145. The audio/video switcher 385 may be a Digital Media Switcher with interface cards that is available from Crestron Electronics, Inc. of Rockleigh, N.J. The audi/video switcher 385, in turn, is connected to an ethernet switch 70, which in turn, is connected to an AV control system 12. The AV control system 12 is connected to various conference room devices 102 via a wired or wireless connection.

The conference room devices 102 include various types of audio/visual equipment in addition to devices used to control the ambient conditions of the meeting or conference room 101. For example, audio/visual equipment includes, but is not limited to, cameras 2, VCR 4, DVD 6, projector 16, CD player 10, one or more local computers 5, AV control device 12, DVR (not shown), cable television box (not shown), and television (not shown) such as plasma, liquid crystal display, light-emitting diode flat panel, and cathode ray tube television. The AV control device 12 may be a Crestron 2-Series Control system available from Crestron Electronics, Inc. of Rockleigh, N.J. The Crestron 2-Series Control system provides a complete integrated AV or automation solution. Every audio, video, and environmental element of the conference room 101 becomes integrated and accessible through the AV control device 12.

Conference room devices 102 used to control the ambient conditions of the conference or meeting room 101 includes access control devices such as security devices 73 (e.g., door locks), lighting system device 71, a projector screen 77, audio speakers 78, window coverings such as blinds/drapes 14, a telephone 18, a Heating, Ventilating, and Air Conditioning (HVAC) system device 72, and an electronic white board 20.

The ethernet switch 70 is connected to a wireless gateway 165. The wireless gateway 165 may be a wireless Wi-Fi gateway and/or a wireless Zigbee gateway. The wireless Wi-Fi gateway and wireless Zigbee gateway may be combined into a single wireless gateway device 165.

Local control of the conference room devices 102 is provided via a set of menus that form a graphical user interface (GUI) displayed on a menu display and user input device 22, which may be a touch panel or similar system. The touch panel may be used to display a user interface with intuitive controls to control some or all of the functions of connected conference room devices 102. Alternatively, or in combination, remote control of one or more conference room devices 102 may be provided by a remotely located computer 103, which communicates with the ethernet switch 70 via a computer network 104. In one embodiment, computer network 104 may include any of a number of local and wide area networks including the Internet.

A system 200 is another example to control the conference room devices 102. More specifically, FIG. 2 illustrates the system 200 for connecting a portable audio visual device to an integrated AV presentation system. The system 200 comprises a cable clamp user interface 100 for bidirectional communications with at least one conference room device 102. Referring to FIGS. 4 and 5, the cable clamp 100 comprises top and bottom portions 245, 250; and first and second half members 110, 115. The first and second half members 110, 115 may be cylindrically shaped. Each of the first and second half members 110, 115 includes first and second mating surfaces 120, 125, and interior and exterior surfaces 130, 135. The first and second half members 110, 115 are connected at the first mating surfaces 120 thereof such that the first and second half members 110, 115 form a passageway 140 for receiving a cable 145 (see FIG. 6) therethrough. The first and second half members 110, 115 may be hinged at the first mating surfaces 120 to form the passageway 140.

The cable clamp 100 further includes at least one actuator 150, at least one indicator 155, and a transceiver 160. The at least one actuator 150 and at least one indicator 155 are disposed on one of the exterior surfaces 135. The transceiver 160 transmits data including data regarding the at least one actuator 150 and receives data including data regarding the at least one indicator 155 via the wireless link. The cable clamp 100 further includes a processing unit 170. The processing unit 170 is connected to the at least one actuator 150, the at least one indicator 155, and the transceiver 160. The processing unit 170 is located within one of the first and second half members 110, 115. The transceiver 160 may be an infrared or ultrasonic transceiver.

Referring back to FIG. 2, the system 200 further includes a receptacle 255 located within a cable storage compartment 260 for storing and recharging the cable clamp 100. The user 305 is able store the cable clamp 100 by inserting the cable clamp 100 into the receptacle 255. The receptacle 255 may include magnets, keying shape or clips to position the cable clamp 100 into the receptacle 255.

The storage compartment 260 can be a flip top to provide control and connectivity solution. The flip top is flush mounted onto a tabletop. When the lid of the flip top opens, a color touch panel and key pad are exposed. The flip top includes a cable storage compartment to keep interface cables 145, 262a-n readily available for plugging in computers, AV sources, and a host of other conference room devices 102. Attached to the storage compartment 260 is the receptacle 255. The receptacle 255 is mechanically and electrically connectable and disconnectable from the bottom portion 250 of the cable clamp 100.

Referring to FIG. 3, the receptacle 255 recharges the energy storage device 355 that is in the cable clamp 100. The receptacle 255 includes at least one charging output contact 270 that is located, for example, on the cavity surface. The cable clamp 100 includes at least one charging input contact 275 that is located on one of the exterior surfaces 135 of the first and second half members 110, 115. When the receptacle 255 receives the cable clamp 100, the at least one charging output contact 270 is in electrical contact with the at least one charging input contact 275 because the output contact 270 mates with the input contact 275. The at least one charging output contact 270 is electrically connected to a power cord 365. It should be understood that other charging methods can be implemented besides having input and output contacts 275, 270 in electrical contact. For example, the receptacle 255 can be a contactless charging station that avoids contact failure between input and output contacts 275, 270. The receptacle 255 includes a contactless charging circuit 360 to charge the energy storage device 355.

The system 200 further includes a cable retractor 265 for retracting and storing a length of the cable 145. Cables 145, 262a-262n are often longer than required in the particular environment in which the conference room devices 102 are used. As a result, the excess length of the cable 145, 262a-262n hangs in the storage compartment and/or is underneath the table, and is liable to get caught on objects. To avoid such a problem, the cable retractor 265 includes a mechanism for releasably retracting and storing a length of the cable 145. The retractor 265 may be located underneath the table and adjacent to the storage compartment such that the retractor 265 is not in plain view of the user 305. The cable 145 has first and second ends 370, 375. The first end 370 is connected to the computer 380 and the second end 375 is connected to one of the conference room devices 102 such as an audio/video switcher 385. The cable length is wound up in the cable retractor 265.

FIGS. 4 and 5 are schematic diagrams illustrating interior views of the cable clamp user interface 100. FIG. 6 is a schematic diagram illustrating an exterior view of the cable clamp user interface 100. The cable clamp 100 communicates audiovisual information to, for example, the computer 380 via a wireless communication link in a bidirectional manner.

Referring to FIGS. 4-6, the cable clamp 100 includes a first half member 110 and a second half member 115. Each of the first and second half members includes first and second mating surfaces 120, 125, and interior and exterior surfaces 130, 135. The first and second half members 110, 115 are connected at the first mating surfaces 120 thereof such that the first and second half members 120, 125 form a passageway 140 for receiving the cable 145 therethrough. The cable clamp 100 further includes at least one actuator 150 disposed on one of the exterior surfaces 135, at least one indicator 155 disposed on one of the exterior surfaces 135, a transceiver 160 to transmit data regarding the at least one actuator 150 and to receive data regarding the at least one indicator 155 (via a wireless link), and a processing unit 170. The processing unit 170 is connected to the at least one actuator 150, the at least one indicator 155, and the transceiver 160. The processing unit 170 is located within one of the first and second half members 120, 125. When a user 305 activates the at least one actuator 150, one of the conference room devices 102 can be controlled remotely.

In one embodiment, the wireless link includes, but is not limited to, a Wi-Fi link, Bluetooth link, Zigbee/IEEE 802.15.4 link, proprietary UHF data link, and cellular link. Advantages of the Zigbee/IEEE 802.15.4 link includes encryption, repeating mesh technology, and low power consumption. A single chip device that includes a microprocessor, power supply, and RF transceiver allows a Zigbee implementation to be small. It should be understood that other wireless link can be used for wireless communication.

The cable clamp 100 includes a locking mechanism 180 disposed on the two half members 110, 115 to maintain closure. With the two half members 110, 115 being in a locked position, the cable clamp 100 is able to slide freely with respective to the cable 145. In one embodiment, the locking mechanism 180 includes a rubber band (not shown) and a screw and a nut (not shown). The rubber band may be wrapped around the two half members 110, 115 to keep the two half members 110, 115 in a closed position. Alternatively, a screw and nut can be used to lock the two half members 110, 115 together.

In another embodiment, the locking mechanism 180 includes at least one tab 185 formed on the second mating surface 125 of the first half member 110 and at least one slot 190 formed on the second mating surface 125 of the second half member 115. The at least one tab 185 engages the at least one slot 190 to maintain the two half members 110, 115 in a locked position.

With the two half members 110, 115 being in a closed or locked position, the cable clamp 100 is able to slide freely relative to the cable 145 until the cable clamp 100 makes contact with a connector 116, which is attached to one end of the cable 145. The length of the connector 116 is larger than the diameter of the passageway 140 to prevent the cable clamp 100 from sliding off the cable 145. The diameter of the passageway (labeled as "D") is between 0.1 inches to 1.5 inches. The two half members 110, 115 have a length (labeled as "L") between 0.9 inches to 1.7 inches.

The two half members 110, 115 are made of a polymeric material that includes, but is not limited to, polypropylene, polystyrene, polyester, polyvinyl chloride, polyethylene, polycarbonate, and polyurethane. The two half members 110, 115 may also be made of a non-polymeric material such as mica, ceramics, various glasses, quartz, and wood.

The cable 145 for communicating between the computer 380 and audio/video switcher 385 includes a VGA cable, DVI cable, HDMI cable, Display Port cable, CAT-5, CAT-6, optical fiber, USB cable, analog or any type of audio or video cable.

The at least one actuator 150 includes, but is not limited to, a pushbutton, dial button, toggle button, slide button, rocker button, and proximity switch. The at least one actuator 150 may also be a touch screen element.

FIG. 7 is an electrical block diagram of the cable clamp 100. The cable clamp includes a processing unit 170. The processing unit 170 includes the transceiver 160 for transmitting and receiving data in a bidirectional manner (or 2-way communication) with the wireless gateway 165. The wireless gateway 165 may be a 2-way Radio Frequency (RF) gateway/transceiver designed to enable communications and management for wireless network of conference room devices 102 such as dimmers 345 and thermostats (not shown). The wireless gateway 165 links the network to an ethernet switch 70 (see FIG. 1) via high-speed ethernet or "Wi-Fi friendly" RF technology that permits selection from 16 Industrial, Scientific and Medical (ISM) channels within the 2.4 GHz spectrum to minimize the possibility of interference with other RF equipment including 802.11 devices. Moreover, by operating in the 2.4 GHz spectrum, an antenna 195 can be a small chip antenna that fits easily in the cable clamp 100. The gateway 165, for example, may be a CEN-RFGW-EX infiNET EX Wireless Gateway that is available from Crestron Electronics, Inc. of Rockleigh, N.J.

The processing unit 170 further includes a memory device. The memory device 175 stores data such as data regarding the actuator 150 and indicator 155. The memory device 175, for example, is a Random-access Memory (RAM), Read-only Memory (ROM), Electrically Erasable Programmable Read-Only Memory (EEPROM), or disk. The processing unit 170 is connected to an energy storage device 355. The energy storage device 355 supplies electrical power. The energy storage device 355 is a battery that may be, but is not limited to, a coin cell battery, lithium polymer battery, nickel-cadmium battery, and alkaline battery.

The processing unit 170 is connected to an antenna 195, the at least one actuator 150, and the at least one indicator 155. The antenna 195 communicates with the conference room devices 102 via the wireless gateway 165. The at least one indicator 155 includes, but is not limited to, a Light-Emitting Diode (LED), a Liquid Crystal Display (LCD), an Organic Light Emitting Diode (OLED) dot matrix display, a transflective e-paper.

A variety of interface behaviors between the cable clamp 100 and the conference room devices 102 will be described. Referring to FIG. 8, in one embodiment, the cable clamp 100 communicates wirelessly in a bidirectional manner with the wireless gateway 165, which in turn, communicates with the ethernet switch 70. The ethernet switch 70 is connected to the AV control system 12. The AV control system 12, in turn, is connected to the conference room devices 102, for example, a projector 16 and a projector screen 77. A video signal 215 is initially available in the cable 145. The transceiver 160 initially receives a first status message 205 via the wireless link from the gateway 165 that indicates the video signal 215 is in the cable 145. In response to the transceiver 160 receiving the first status message 205, the first indicator 155 switches to an "on" state to indicate reception of the first status message 205. If the transceiver 160 did not receive the first status message 205, the first indicator 155 would be in the "off" state to indicate non-reception of the first status message 205. A user 305 is able to obtain visual feedback as to whether the video signal 215 is readily available in the cable 145 by looking at the first indicator 155.

If the video signal 215 is available (as displayed by the first indicator 155), the user 305 actuates the at least one actuator 150 to accept the video signal 215 that is currently available in the cable 145. In response to the actuation, the transceiver 160 transmits a command message 220 to accept the video signal 215 via the wireless link to the gateway 165, which in turn, is connected to the ethernet switch 70. The ethernet switch 70, in turn, is connected to the AV control system 12. The AV control system 12 communicates with the projector 16 to maintain the video signal 215 in the cable 145. The user 305 then plugs the cable 145 into the computer 380, for example, a laptop computer, knowing that the video signal 215 is available in the cable 145. The user 305 inputs a series of commands on the keyboard so that the computer 380 outputs an external video signal 107 to the projector 16. The external video signal 107 includes informational data 225 to be displayed on the projector screen 77. The informational data 225 is any data that the user 305 wants to display on the projector screen 77, for example, a video presentation.

The cable clamp 100 further includes second and third indicators 230, 235. The second and third indicators 230, 235 display at least five states differentiated by color. The first colored state is off when the cable clamp 100 is in a powered "off" state. The second colored state is activated when the cable clamp 100 is in a powered "on" state. The cable clamp 100 is powered on in response to the user 305 pressing one of the actuators 150. The third colored state is activated when the AV control system 12 makes the video signal 215 available in the cable 145 and the wireless gateway 165 selects the video signal 215. Once the user 305 sees that the third colored state is activated, the user 305 can press one of the actuators 150 to accept the video signal 215. The fourth colored state is activated in response to the actuation by the user 305. The user 305 can easily see that the video signal 215 is active and is accepted because the second and/or third indicators 230, 235 display the fourth colored state. The user 305 can then input keyboard sequence on the computer 380 to execute an output of the external video signal 107. The external video signal 107 includes informational data 225. The fifth colored state is activated in response to the informational data 225 being transmitted in the cable 145. The user 305 can easily see that the computer 380 is outputting the external video signal 107 because the second and/or third indicators 230, 235 display the fifth colored state, which assists the user 305 to configure the computer 380 properly. It should be understood that any of the colored states when activated may blink on and off.

In another interface behavior, the signal in the cable 145 is not initially the video signal 215 (as illustrated in FIG. 8) but rather is a signal associated with another conference room device 102 that is not the projector 16. In this embodiment, the user 305 may not know which of the conference room devices 102 is associated with the signal in the cable 145. Referring to FIG. 9, the gateway 165 initially transmits to the transceiver 160 a first status message 280. The first status message 280 indicates which one of the conference room devices 102 has a signal source 285 that is currently in the cable 145. The signal source 285 is associated with one of the conference room devices 102. In response to the transceiver 160 receiving the first status message 280, the first indicator 155 switches to an "on" state to indicate reception of the first status message 280. If the transceiver 160 did not receive the first status message 280, the first indicator 155 would be in the "off" state to indicate non-reception of the first status message 280.

The user 305 selects a desired device, which is one of the conference room devices 102, by actuating one of the actuators 150. In response to the actuation, the transceiver 160 transmits a desired device command 295 for a desired device signal 287 to be available in the cable 145 via the wireless link to the gateway 165. The gateway 165, in turn, communicates with the AV control system 12 via the ethernet switch 70. The AV control system 12 is connected to the conference room devices 102. In response to the AV control system 12 receiving the desired device command 295, the AV control system 12 sends the desired device signal 287 in the cable 145. The desired device signal 287 is associated with one of the conference room devices 102. The gateway 165 transmits to the transceiver 160 a second status message 310 that indicates that the desired device signal 287 is available in the cable 145. The second and/or third indicators 230, 235 are activated in response to the transceiver 160 receiving the second status message 310. The user 305 may then plug the cable 145 into the computer 380 with the confidence that the desired device signal 287 is available in the cable 145.

It should be understood that the actuator 150 may be a touch panel. The touch panel can display which one of the conference room devices 102 is active when the transceiver 160 receives the first status message 280. The touch panel includes a GUI interface and the user 305 can scroll through various menus on the touch panel to select the user desired device, which is one of the conference room devices 102.

FIGS. 10-12 illustrate various commands that the cable clamp 100 is able to send to the gateway 165 to control one of the conference room devices 102. FIG. 10 illustrates an embodiment in which the cable clamp 100 is communicating wirelessly in a bidirectional manner with the gateway 165. The transceiver 160 transmits a power message 325 to switch one of the conference room devices 102 between a power "on" and "off" state in response to the user 305 activating a second actuator 320. In the power "off" state, the conference room 101 may be in a non-AV configuration.

FIG. 11 illustrates an embodiment in which the cable clamp 100 is communicating wirelessly in a bidirectional manner with the gateway 165. The transceiver 160 transmits a control message 335 to lower or raise the projector screen 77 in response to the user 305 activating the second actuator 320.

FIG. 12 illustrates an embodiment in which the cable clamp 100 is communicating wirelessly in a bidirectional manner with the gateway 165. The transceiver 160 transmits a dimmer message 350 to dim the lighting system device 71 in response to the user 305 activating the second actuator 320.

FIG. 13 is a flowchart 1100 illustrating a method in accordance with an illustrative embodiment of the present invention for communicating a computer to an integrated AV presentation system. In step 1105, a cable clamp 100 is provided for bidirectional communications with at least one conference room device 102. The cable clamp 100 includes top and bottom portions 245, 250 and first and second half members 110, 115. Each of the first and second half members 110, 115 includes first and second mating surfaces 120, 125, and interior and exterior surfaces 130, 135. The first and second half members 110, 115 are connected at the first mating surface 120 thereof such that the first and second half members 110, 115 form a passageway 140 for receiving a cable 145 therethrough.

In step 1110, the user 305 attaches the cable clamp 100 to the cable 145 by inserting the cable 145 through the passageway 140. In step 1115, the user 305 then mates the first and second half members 110, 115 to form the passageway 140. In step 1120, a free end of the cable 145 is connected into a port of a computer 380. In step 1125, a transceiver 160 receives a first status message 205 from a gateway 165 via a wireless link that indicates that a video signal 215 is available in the cable 145. In step 1126, the transceiver 160 transmits a command message 220 via the wireless link to the gateway 165 to accept the video signal 215, in response to the user 305 actuating one of the least one actuator 150.

FIG. 14 includes additional steps that may be arranged in any manner to support operation in various configurations. More specifically, in step 1130, the user locks the two half members 110, 115 to maintain closure. In the closed position, the cable clamp 100 is able to slide freely relative to the cable 145. In step 1135, the first indicator 155 is activated between an "on" state and an "off" state. The first indicator 155 allows the user 305 to recognize whether there is the video signal 215 available in the cable 145. The first indicator 155 is located on one of the exterior surfaces 135. The first indicator 155 is in the "on" state to indicate reception of the first status message 205 by the transceiver 160 and the first indicator 155 is in the "off" state to indicate non-reception of the first status message 205 by the transceiver 160.

In step 1140, second and third indicators 230, 235 are activated. The second and third indicators 230, 235 further assist the user 305 in setting up the computer 380 to connect to one of the conference room devices 102. The second and third indicators 230, 235 are located on one of the exterior surfaces 135. The second and third indicators 230, 235 display at least five states differentiated by color. The first colored state is off when the cable clamp 100 is in a powered "off" state. The second colored state is activated when the cable clamp 100 is in a powered "on" state. The third colored state is activated when the video signal 215 is active in the cable 145 and selected by the gateway 165. The user 305 then activates the at least one actuator 150 to accept the video signal 215. The fourth colored state is activated in response to the actuation. The fifth colored state is activated in response to the computer 380 transmitting informational data in the cable 145.

In another embodiment, the user 305 prefers another signal besides the video signal 215 that is initially active in the cable 145. In step 1145, the transceiver 160 transmits a desired device command 295 for a desired device signal 287 to be available in the cable 145 via the wireless link to the gateway 165. In step 1150, a second status message 310 is received by the transceiver 160 via the wireless link from the gateway 165 that indicates that the desired device signal 287 is available in the cable 145.

In step 1155, the cable clamp 100 is inserted into an opening of receptacle 255 for storing the cable clamp 100. In step 1160, the energy storage device 355 is recharged by the receptacle 255.

It should be understood that the cable clamp 100 can be used in a new or existing conference room. However, the cable clamp 100 also can be used in other types of environment. Referring to FIG. 15, for example, the cable clamp 100 is used in a residential television environment 1400. The cable clamp 100 attaches to a VGA cable 145 that is connected to a television 82. The cable clamp 100 communicates wirelessly in a bidirectional manner with a wireless gateway (not shown). The wireless gateway (not shown) may be a Wi-Fi device that is built into the television 82.

Without the cable clamp 100, when a user 305 switches to a VGA source using a remote controller 80, the television 82 displays "VGA No Video" or a similar message when there is no video signal 215. With the cable clamp 100, the user 305 is able to look at the indicator 155 to determine if the video signal is available in the cable 145. If the indicator 155 is in the "on" state, the video signal 215 is available in the cable 145 and the user 305 may press one of the actuators 150 to accept the video signal 215. The television 82 would not display the "VGA No Video" because the user 305 would not press the VGA signal on the remote controller 80 without confirmation from the cable clamp 100 that the video signal 215 is available in the cable 145.

Industrial Applicability

To solve the aforementioned problems, the present invention is a unique device, system, and method for coupling audio/visual devices to a network.

List of Acronyms Used in the Detailed Description of the Invention

The following is a list of the acronyms used in the specification in alphabetical order.

AV Audio Visual
CAT Category
CD Compact Disc
DVD Digital Video Disc or Digital Versatile Disc
DVI Digital Visual Interface
EEPROM Electrically Erasable Programmable Read-Only Memory
GUI Graphical User Interface
HDMI High-Definition Multimedia Interface
HVAC Heating, Ventilating, and Air Conditioning
ISM Industrial, Scientific and Medical
LCD Liquid Crystal Display
LED Light-Emitting Diode
OLED Organic Light Emitting Diode
RAM Random-access Memory
RF Radio Frequency
ROM Read-only Memory
UHF Ultra High Frequency
USB Universal Serial Bus
VCR Videocassette Recorder
VGA Video Graphics Array Alternate Embodiments Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

For example, any of the flow diagrams described herein may be modified or arranged in any manner to support operation in various configurations. The flow diagrams may include more or fewer blocks, combined or separated blocks, alternative flow arrangements, or the like. The flow diagrams may also be implemented in the form of hardware, firmware, or software. If implemented in software, the software may be written in any suitable code in accordance with the example embodiments herein or other embodiments. The software may be stored in any form of computer readable medium and loaded and executed by a general purpose or application specific processor suitable to perform the example embodiments described herein or other embodiments.

What is claimed is:

1. A cable clamp (100), comprising:
   (a) a first half cylindrical member (110);
   (b) a second half cylindrical member (115),
      (i) each of the first and second half cylindrical members having first and second mating surfaces (120, 125), and interior and exterior surfaces (130, 135),
      (ii) the first and second half cylindrical members being connectable at the first mating surfaces thereof such that the first and second half cylindrical members form a passageway (140) for receiving a cable (145) therethrough;
   (c) at least one actuator (150) disposed on one of the exterior surfaces;
   (d) at least one indicator (155) disposed on one of the exterior surfaces; and
   (e) a transceiver (160) configured to transmit data regarding the at least one actuator and to receive data regarding the at least one indicator via a wireless link.

2. The cable clamp of claim 1, further comprising:
   (a) a processing unit (170) coupled to the at least one actuator, the at least one indicator, and the transceiver, the processing unit being located within one of the first and second half members; and
   (b) a memory device (175) configured to store data regarding the at least one actuator and the at least one indicator.

3. The cable clamp of claim 1, further comprising:
   (a) a locking mechanism (180) disposed on the two half cylindrical members to maintain closure.

4. The cable clamp of claim 3, wherein:
   (a) the locking mechanism is an elastic band.

5. The cable clamp of claim 3, wherein the locking mechanism comprises:
   (a) at least one tab (185) formed on the second mating surface of the first half member; and
   (b) at least one slot (190) formed on the second mating surface of the second half member, the at least one tab configured to engage the at least one slot.

6. The cable clamp of claim 1, further comprising:
   (a) an antenna (195) coupled to the transceiver, the antenna configured to communicate via the wireless link.

7. The cable clamp of claim 1, wherein:
   (a) the passageway has a diameter between 0.1 inches to 1.5 inches; and
   (b) the first and second half cylindrical members have a length between 0.9 inches to 1.7 inches.

8. The cable clamp of claim 1, wherein:
   (a) the transceiver is an infrared transceiver configured to transmit/receive data regarding the at least one actuator and the at least one indicator.

9. The cable clamp of claim 1, wherein:
   (a) the transceiver is an ultrasonic transceiver configured to transmit/receive data regarding the at least one actuator and the at least one indicator.

10. The cable clamp of claim 1, wherein:
   (a) the first and second half cylindrical members comprise one of a:
      (i) polypropylene,
      (ii) polystyrene,
      (iii) polyester,
      (iv) polyvinyl chloride,
      (v) polyethylene,
      (vi) polycarbonate, or
      (vii) polyurethane.

11. The cable clamp of claim 1, wherein the wireless link comprises at least one of:
(a) a Wi-Fi link,
(b) a Bluetooth link,
(c) a Zigbee/IEEE 802.15.4 link, or
(d) a proprietary UHF data link.

12. The cable clamp of claim 1, wherein the transceiver is configured to:
(a) receive a first status message (205) from a gateway (165) that indicates that a video signal (215) is available in the cable, and
(b) transmit a command message (220) to the gateway to accept the video signal.

13. The cable clamp of claim 11, wherein the at least one indicator comprises:
(a) a second indicator (230), each of the first and second indicators are configured to display
  (i) an "on" state, and
  (ii) an "off" state;
(b) wherein the first indicator is in the "on" state to indicate reception of the first status message by the transceiver; and
(c) wherein the first indicator is in the "off" state to indicate non-reception of the first status message by the transceiver.

14. The cable clamp of claim 13, wherein the at least one indicator further comprises a third indicator (235):
(a) the second and third indicators are configured to display at least five states differentiated by color,
  (i) the first colored state being in the "off" state when the cable clamp is powered off,
  (ii) the second colored state being activated when the cable clamp is in the powered "on" state,
  (iii) the third colored state being activated when the video signal is active in the cable and selected by the gateway,
  (iv) the fourth colored state being activated in response to the at least one actuator being activated to accept the video signal, and
  (v) the fifth colored state being activated in response to a computer (380) configured to transmit informational data (225) in the cable.

15. The cable clamp of claim 1, wherein:
(a) the at least one indicator comprises at least one of:
  (i) a LED,
  (ii) a LCD,
  (iii) an OLED dot matrix display, or
  (iv) a transflective e-paper.

16. The cable clamp of claim 1, wherein:
(a) the cable comprises at least one of:
  (i) a VGA cable,
  (ii) a DVI cable,
  (iii) a HDMI cable,
  (iv) a Display Port cable,
  (v) CAT-5,
  (vi) CAT-6,
  (vii) an optical fiber, or
  (viii) a USB cable.

17. The cable clamp of claim 1, wherein:
(a) the at least one actuator comprises at least one of:
  (i) a pushbutton,
  (ii) a dial button,
  (iii) a toggle button,
  (iv) a slide button,
  (v) a rocker button, or
  (vi) a proximity switch.

18. The cable clamp of claim 1, wherein the at least one actuator is a touch screen element.

19. A cable clamp (100), comprising:
(a) a first half member (110);
(b) a second half member (115),
  (i) each of the first and second half members having first and second mating surfaces (120, 125), and interior and exterior surfaces (130, 135),
  (ii) the first and second half members being connectable at the first mating surfaces thereof such that the first and second half members form a passageway (140) for receiving a cable (145) therethrough;
(b) at least one actuator (150) disposed on one of the exterior surfaces;
(c) first, second, and third indicators (155, 230, 235) disposed on one of the exterior surfaces; and
(d) a transceiver (160) configured to transmit data regarding the at least one actuator and to receive data regarding the at least one indicator via a wireless link;
(e) wherein the transceiver is configured to
  (i) receive a first status message (205) from a gateway (165) that indicates that a video signal (215) is available in the cable, and
  (ii) transmit a command message (220) to the gateway to accept the video signal; and
(f) wherein each of the first and second indicators is configured to display
  (i) an "on" state, and
  (ii) an "off" state,
  (iii) the first indicator is in the "on" state to indicate reception of the first message by the transceiver,
  (iv) the first indicator is in the "off" state to indicate non-reception of the first message by the transceiver, and
  (v) the second and third indicators are configured to display at least five states differentiated by color,
    (A) the first colored state being in the "off" state when the cable clamp is powered off,
    (B) the second colored state being activated when the cable clamp is in the powered "on" state,
    (C) the third colored state being activated when the video signal is active in the cable and selected by the gateway,
    (D) the fourth colored state being activated in response to the at least one actuator being activated to accept the video signal, and
    (E) the fifth colored state being activated in response to a computer (380) configured to transmit informational data (225) in the cable.

20. The cable clamp of claim 19, further comprising:
(a) an antenna (195) coupled to the transceiver, the antenna configured to communicate via the wireless link.

21. The cable clamp of claim 19, wherein:
(a) the transceiver is an infrared transceiver configured to transmit/receive data regarding the at least one actuator and the at least one indicator.

22. A system (200) for connecting a computer to an integrated AV presentation system, comprising:
(a) a cable clamp (100) configured for bidirectional communications with at least one conference room device (102), the cable clamp comprising
  (i) a passageway (140) for receiving a cable (145) therethrough;
  (ii) at least one actuator (150),
  (iii) at least one indicator (155), (iv) a transceiver (160) configured to transmit data regarding the at least one actuator and to receive data regarding the at least one indicator via a wireless link, and (b) a receptacle (255) located within a cable storage compartment (260), (i) the receptacle being connectable and disconnectable from the cable clamp; and (c) a cable retractor (265) configured to retract and store a length of the cable.

23. The system of claim 22, wherein the cable clamp further comprises:

(a) top and bottom portions (245, 250); and (b) first and second half members (110, 115), each of the first and second half members having (i) first and second mating surfaces (120, 125), (ii) interior and exterior surfaces (130, 135), and (iv) a processing unit (170) coupled to the at least one actuator, the at least one indicator, and the transceiver, the processing unit being located within one of the first and second half members, (v) wherein the first and second half members being connectable at the first mating surfaces thereof such that the first and second half members form the passageway (140) for receiving the cable (145) therethrough.

24. The system of claim 22, further comprising:

(a) an antenna (195) coupled to the transceiver;

(b) wherein the antenna is configured to communicate via the wireless link.

25. The system of claim 22, wherein:

(a) the wireless link comprises at least one of:

(i) a Wi-Fi link, (ii) a Bluetooth link, (iii) a Zigbee/IEEE 802.15.4 link, or (iv) a proprietary UHF data link.

26. The system of claim 22, wherein the transceiver is configured to:

(a) receive a first status message (205) from a gateway (165) that indicates that a video signal (215) is available in the cable, and (b) transmit a command message (220) to the gateway to accept the video signal.

27. The system of claim 26, wherein the at least one indicator comprises:

(a) second and third indicators (230, 235);

(b) wherein each of the first and second indicators are configured to display (i) an "on" state, and (ii) an "off" state;

(c) wherein the first indicator is in the "on" state to indicate reception of the first status message by the transceiver; and (d) wherein the first indicator is in the "off" state to indicate non-reception of the first status message by the transceiver.

28. The system of claim 27, wherein:

(a) the second and third indicators are configured to display at least five states differentiated by color, (i) the first colored state being in the "off" state when the cable clamp is powered off, (ii) the second colored state being activated when the cable clamp is in the powered "on" state, (iii) the third colored state being activated when the video signal is active in the cable and selected by the gateway, (iv) the fourth colored state being activated in response to the at least one actuator being activated to accept the video signal, and (v) the fifth colored state being activated in response to a computer (380) configured to transmit informational data (225) in the cable.

29. The system of claim 22, wherein:

(a) the transceiver is configured to (i) receive a first status message (280) via the wireless link from a gateway (165) that indicates a signal source (285) that is associated with one of the at least one conference room devices (102) is available in the cable, (ii) transmit a desired device command (295) for a desired device signal (287) to be available in the cable via the wireless link to the gateway in response to a user (305) activating the at least one actuator, the desired device signal is associated with one of the at least one conference room devices, and (iii) receive a second status message (310) via the wireless link from the gateway that indicates that the desired device signal is available in the cable.

30. The system of claim 22, wherein:

(a) the at least one actuator comprises a second actuator (320); and (b) the transceiver is further configured to (i) transmit a power message (325) to switch one of the at least one conference room devices on or off in response to the second actuator being activated.

31. The system of claim 22, wherein:

(a) the at least one actuator comprises a second actuator (320);

(b) the at least one conference room device is a projector screen (77); and (c) the transceiver is further configured to (i) transmit a control message (335) to lower or raise the projector screen (77) in response to the second actuator being activated.

32. The system of claim 22, wherein:

(a) the at least one actuator comprises a second actuator (320);

(b) the at least one conference room device is a dimmer (345) for a lighting system device (71); and (c) the transceiver is further configured to (i) transmit a dimmer message (350) to dim the lighting system device in response to the second actuator being activated.

33. The system of claim 22, wherein the cable clamp further comprises:

(a) an energy storage device (355) to supply electrical power.

34. The system of claim 33, wherein the receptacle further comprises:

(a) a contactless charging circuit (360) configured to charge the energy storage device.

35. The system of claim 34, wherein the energy storage device is a battery comprises at least one of:

(a) a coin cell battery, (b) a lithium polymer battery, (c) a nickel-cadmium battery, or (d) an alkaline battery.

36. The system of claim 22, wherein the cable clamp further comprises:

(a) at least one charging input contact (275) being disposed on one of the exterior surfaces of the first and second half members.

37. The system of claim 36, wherein the receptacle comprises:
- (a) at least one charging output contact (270);
- (b) wherein the at least one charging output contact being in electrical contact with at least one charging input contact.

38. The system of claim 36, wherein:
- (a) the at least one charging output contact is electrically connected to a power cord (365).

39. The system of claim 22, wherein the at least one conference room device comprises at least one of:
- (a) an Audio/visual (AV) device;
- (b) a switch device,
- (c) a gateway device,
- (d) a HVAC system,
- (e) a lighting system device,
- (f) a shading system device,
- (g) a projector device,
- (h) a projector screen,
- (i) a DVD,
- (j) a user input device,
- (k) a CD player,
- (l) a security system device,
- (m) a television, or
- (n) an A/V control system.

40. The system of claim 22, wherein the cable comprises:
- (a) a first end; and
- (b) a second end (370, 375);
- (c) wherein the first end is connected to a computer (380); and
- (d) wherein the second end is connected to an audio/video switcher (385).

41. The system of claim 22, wherein:
- (a) the transceiver is an infrared transceiver configured to transmit/receive data regarding the at least one actuator and the at least one indicator.

42. A method for communicating information to an integrated AV presentation system, comprising the steps of:
- (a) providing (step 1105) a cable clamp for bidirectional communications with at least one conference room device, the cable clamp comprising
  - (i) top and bottom portions and first and second half members,
    - (A) each of the first and second half members having first and second mating surfaces, and
    - (B) each of the first and second half members having interior and exterior surfaces,
    - (C) wherein the first and second half members being connectable at the first mating surfaces thereof such that the first and second half members form a passageway for receiving a cable therethrough;
- (b) inserting (step 1110) the cable through the passageway in the clamp;
- (c) mating (step 1115) the first and second half members;
- (d) connecting (step 1120) a free end of the cable into a port of a computer;
- (e) receiving (step 1125) a first status message from a gateway via a wireless link to a transceiver that indicates that a video signal is available in the cable; and
- (f) transmitting (step 1126) a command message by the transceiver via the wireless link to the gateway to accept the video signal.

43. The method of claim 42, further comprising the steps of:
- (a) activating (step 1135) a first indicator between an "on" state and an "off" state, the first indicator being disposed on one of the exterior surfaces;
- (b) wherein the first indicator is in the "on" state to indicate reception of the first status message by the transceiver and the first indicator is in the "off" state to indicate non-reception of the first status message by the transceiver.

44. The method of claim 43, further comprising the steps of:
- (a) activating (step 1140) second and third indicators that are disposed on one of the exterior surfaces;
- (b) wherein the second and third indicators display at least five states differentiated by color,
  - (i) the first colored state being in the "off" state when the cable clamp is powered off,
  - (ii) the second colored state being activated when the cable clamp is in the powered "on" state,
  - (iii) the third colored state being activated when the video signal is active in the cable and selected by the gateway,
  - (iv) the fourth colored state being activated in response to the at least one actuator being activated to accept the video signal, and
  - (v) the fifth colored state being activated in response to a computer transmitting informational data in the cable.

45. The method of claim 42, further comprising the step of:
- (a) locking (step 1130) the two half members to maintain closure.

46. The method of claim 42, wherein the wireless link comprises at least one of:
- (a) a Wi-Fi link,
- (b) a Bluetooth link,
- (c) a Zigbee/IEEE 802.15.4 link, or
- (d) a proprietary UHF data link.

47. The method of claim 42, further comprising the steps of:
- (a) transmitting (step 1145) a desired device command 295 for a desired device signal to be available in the cable via the wireless link to the gateway, the desired device signal is associated with one of the at least one conference room devices; and
- (b) receiving (step 1150) a second status message via the wireless link from the gateway that indicates that the desired device signal is available in the cable.

48. The method of claim 42, wherein:
- (a) the cable clamp further comprises an energy storage device for supplying electrical power.

49. The method of claim 48, further comprising the steps of:
- (a) inserting (step 1155) the cable clamp into an opening of the receptacle; and
- (b) charging (step 1160) the energy storage device.

50. The method of claim 42, wherein:
- (a) the transceiver is an infrared transceiver for transmitting/receiving data regarding at least one actuator and at least one indicator.

* * * * *